United States Patent
Yip et al.

(10) Patent No.: US 7,166,395 B2
(45) Date of Patent: Jan. 23, 2007

(54) METHOD AND SYSTEM OF PROCESSING STAMPS

(75) Inventors: Doogong Yip, Green Brook, NJ (US); Steven J. Sculler, Morganville, NJ (US)

(73) Assignee: M&R Marking Systems, Inc., Piscataway, NJ (US)

( * ) Notice: Subject to any disclaimer, the term of this patent is extended or adjusted under 35 U.S.C. 154(b) by 198 days.

(21) Appl. No.: 10/439,469

(22) Filed: May 16, 2003

(65) Prior Publication Data

US 2004/0018438 A1    Jan. 29, 2004

Related U.S. Application Data

(60) Provisional application No. 60/380,974, filed on May 16, 2002.

(51) Int. Cl.
*G03F 9/00* (2006.01)
*G03F 7/20* (2006.01)
*G03B 27/58* (2006.01)
*G03B 27/62* (2006.01)

(52) U.S. Cl. .................. 430/22; 430/320; 430/322; 355/74; 355/75

(58) Field of Classification Search .............. 430/22, 430/320, 322; 355/74, 75
See application file for complete search history.

(56) References Cited

U.S. PATENT DOCUMENTS 6,460,456 B1 * 10/2002 Sugiyama et al. .......... 101/327

FOREIGN PATENT DOCUMENTS

JP       2001-175003    * 6/2001

* cited by examiner

*Primary Examiner*—John A. McPherson
(74) *Attorney, Agent, or Firm*—Lerner, David, Littenberg, Krumholz & Mentlik, LLP

(57) ABSTRACT

A method and system of processing stamps comprising providing a template containing openings, each opening corresponding with an image to be imprinted on a material, whereby the openings are sized to align such material with the images.

65 Claims, 3 Drawing Sheets

METHOD AND SYSTEM OF PROCESSING STAMPS

CROSS-REFERENCE TO RELATED APPLICATIONS

This present application claims the benefit of U.S. Provisional Patent Application Ser. No. 60/380,974 filed on May 16, 2002, the disclosure of which is hereby incorporated by reference herein.

BACKGROUND OF THE INVENTION

Flash exposed pre-inked stamps have been made by printing or otherwise photographically imaging a positive or negative image on a transparent indicia medium, such as paper or plastic, then placing that image on a transparent body of typically glass or plastic in between a light source and the micro-porous material to be exposed. On top of the transparent indicia medium could be a clear protective sheet and then the flash exposable micro-porous material. The micro-porous material then could be compressed to form a compressed surface at the exposure surface. This process is known in the industry under the trademark, "Ultimark."

A disadvantage of this system is that the exposable micro-porous foam must be manually aligned with the indicia to be exposed (i.e., the image or text to appear on the stamp). This requires a careful worker with adequate time. It also results in possible misalignment and/or low manufacturing efficiencies. While this may not be a significant problem with low volume producers who may make up to 20 or more stamps per day with a steady and semi-skilled workforce, it is disadvantageous for large volume producers. Manufacturers producing high volume stamps require a more foolproof and cost efficient system of manufacturing.

SUMMARY OF THE INVENTION

In one aspect, the present invention provides methods and apparatus that use a template to positively align the micro-porous material to the images, thereby increasing productivity and accuracy, while requiring a lesser degree of skill to operate.

In accordance with another aspect of the present invention, material is provided that bears artwork. A template containing one or more openings is placed on top of the clear protective sheet, where each opening of the template corresponds with an image of artwork. The openings and images are aligned, initially using reference circles in the corners of the artwork and template, and are then fine-tuned by visual inspection. Micro-porous material is placed in each opening and then flash-exposed using conventional flash-exposure equipment.

Another aspect of the present invention includes the placing of a clear protective sheet over the artwork material. That sheet can be fastened to the artwork using one or more staples on one or more sides of the artwork.

In another aspect of the present invention, an adhesive is applied along the top edge of the template and then the template with adhesive is placed on the exposure glass of the flash-exposure equipment. That adhesive can be masking tape. The template can be lifted from one side and pivoted away from the exposure area to allow the artwork material to be placed onto the exposure glass below the template.

In another aspect of the present invention, the position of the artwork material can be adjusted from under the template through notches at the sides of the template. Four printed circles at the corners of the artwork can be used for a rough alignment. The alignment of the artwork can be fine-tuned by visual inspection. Another aspect of the invention uses a mechanical system of alignment such as pins, pegs, and various matching shapes. Optical sensors can also be used to detect and align the micro-porous material and the transparent indicia material. Once aligned, an adhesive such as tape, post-it flags, paste or glue can be used at the sides of the artwork to secure the positioning of the artwork to the exposure glass.

In another aspect of the invention, the micro-porous material is placed in the template openings and then flash-exposed. An edge of the template is lifted in order to remove the exposed stamp plates from contact with the clear protective film. The plates are then removed from the template.

Another aspect of the invention comprises an apparatus for exposing flash-exposable material for use in a stamp. This apparatus comprises material bearing at least one image of artwork, a template with openings, an alignment system for aligning the artwork with the template openings, flash-exposable materials, and flash-exposure equipment. A clear protective sheet can also be placed over the artwork material.

DETAILED DESCRIPTION

Figure 1:
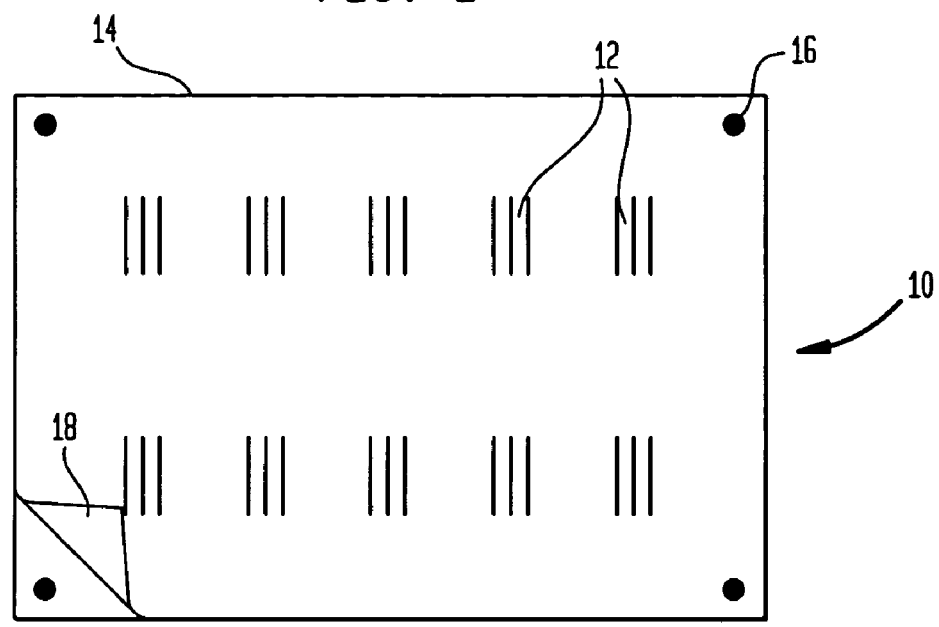
FIG. 1 is a top view of printed artwork in the form of images on transparent paper or plastic with a clear protective film on top in accordance with an aspect of the invention.

As shown in FIG. 1, one aspect of the invention uses artwork 10 in the form of positive or negative images 12 photographically imaged on a transparent indicia material 14. As used herein, images can include, but are not limited to artwork or text, such as names and addresses, identifying indicia, etc. The artwork is typically printed on velum and has reference circles 16 printed in the four corners of the velum for rough alignment purposes.

A clear protective film 18 is used for protection of the printed artwork 10 and is preferably the same size as the artwork 10. A sheet of clear protective film 18 is placed over the printed artwork 10 and fastened together, such as by using two staples 44 along the left side (when viewed in the landscape direction). Preferably, the fasteners are placed so as to not interfere with the template 20 when the template is placed over the artwork 10. Both fasteners 44 are also preferably placed on the same side of the sheet to prevent the bunching of the clear protective film 18 in relation to the printed artwork 10 that may occur if the two were fastened together on more than one side.

Figure 2:
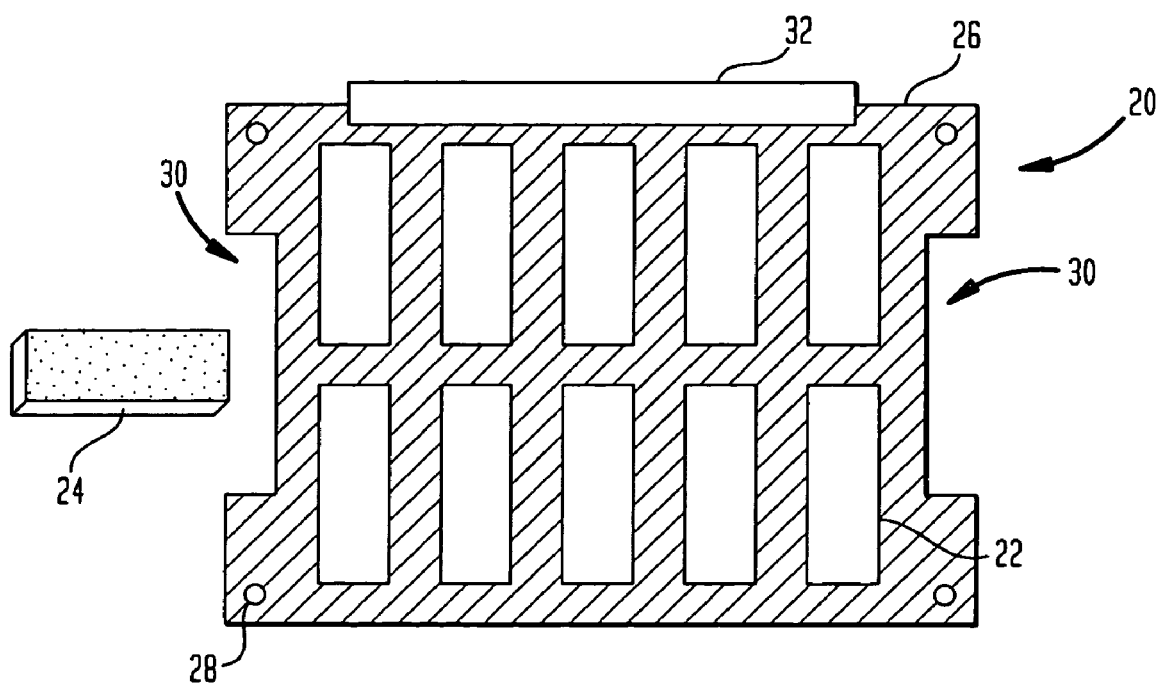
FIG. 2 is a top view of a template and micro-porous material in the form of a stamp text plate in accordance with an aspect of the invention.

FIG. 2. shows a template 20 having openings 22 sized to accept a micro-porous material 24. The micro-porous material 24 upon which the image 12 will be transferred is flash exposable. It is capable of being compressed to form a compressed surface at the area that has been exposed. The image can be exposed by either blocking the light energy with the artwork so that the image area is left unexposed, or by using the negative of the image so that the image becomes sealed and the background is left porous. The area of the material that has not been exposed remains uncompressed and will be the design of the stamp itself.

In another embodiment, the clear protective sheet 18 could have an energy absorbing material incorporated in it, or applied to it, over which the micro-porous material can be placed. Since the material is not heat absorbing, the heat will be transferred from this sheet. The clear protective sheet 18 may also be an independent sheet of the protective film or it could be a transfer material. In the case of a transfer material, the intermediary sheet would contact the material to be imaged. This material could be a stamp, identification product, or product to be identified. The transfer material could either contain an energy absorbing material contained or coated to it, or as an intermediary substrate before the transfer layer. The heat absorbing layer would provide a means for the transfer material to transfer to the surface being imaged when exposed to light energy. The material to be transferred could be, for example, a sealing layer onto a stamp to seal the surface, a hot stamped foil being transferred to a name badge, or other similar applications.

The template material 26 can be made of many different types and thicknesses including films, paper, cardboard, metal or other substances. In one aspect, the template is cut from 0.030" thick grade G-7 Garolite material. The thickness may be varied based on user templates or material requirements. In addition, the sizes of the openings in a template will vary according to the size and type of the stamp to be produced. The template preferably includes visual aids 28 to assist in the alignment of the template with the printed artwork 10. For example, corresponding circles on the template 20 and printed artwork 16 can be used to visually align the artwork with the openings 22 in the template. In addition, the template preferably has notches 30 at the left and right sides to provide an operator with access to the artwork so that the operator may adjust the position of the printed artwork 10 when the template 20 is placed over the artwork 10. In other words, the notches 30 allow the operator to manipulate the artwork 10 when it is under the template 20.

Figure 3:
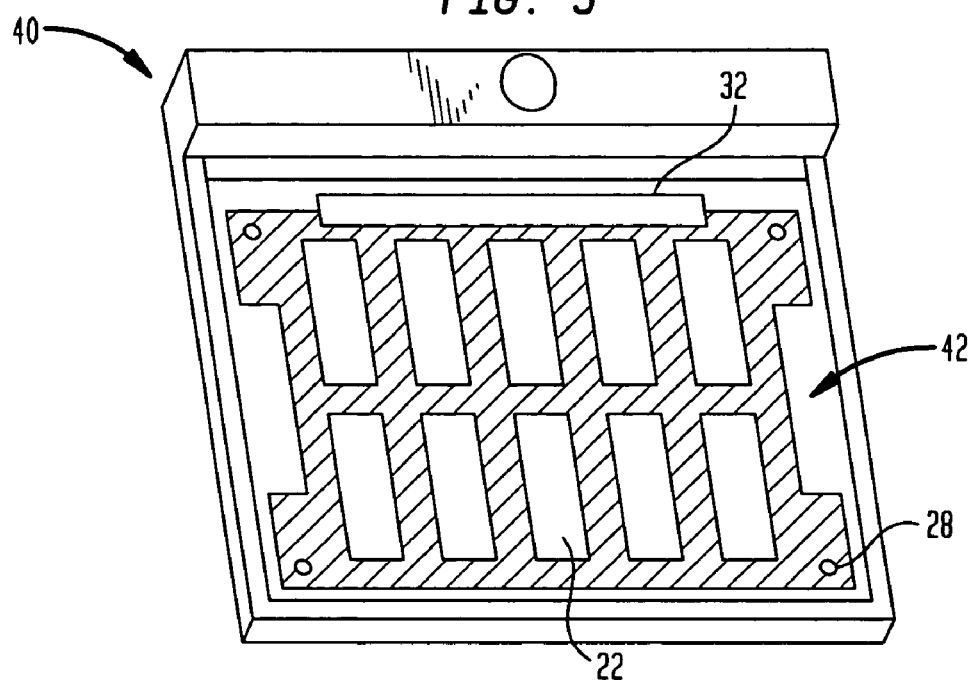
FIG. 3 is a perspective view of a template placed on the flash exposure equipment in accordance with an aspect of the invention.

In one aspect of the invention, the template is pivotably, and removably, affixed to the flash exposure equipment. For example, a strip of masking tape 32 may be applied along the top edge of the template 20. The template 20 with the masking tape 32 is placed onto the exposure glass 42 of the flash exposure equipment 40 as shown in FIG. 3. The masking tape 32 is then pressed to the glass 42 for a firm but removable bond, allowing the template 20 to be lifted from the front and pivoted away from the exposure area. The masking tape 32 acts as a hinge and allows the template 20 to be consistently returned to the same position with respect to the exposure glass 42.

Figure 4:
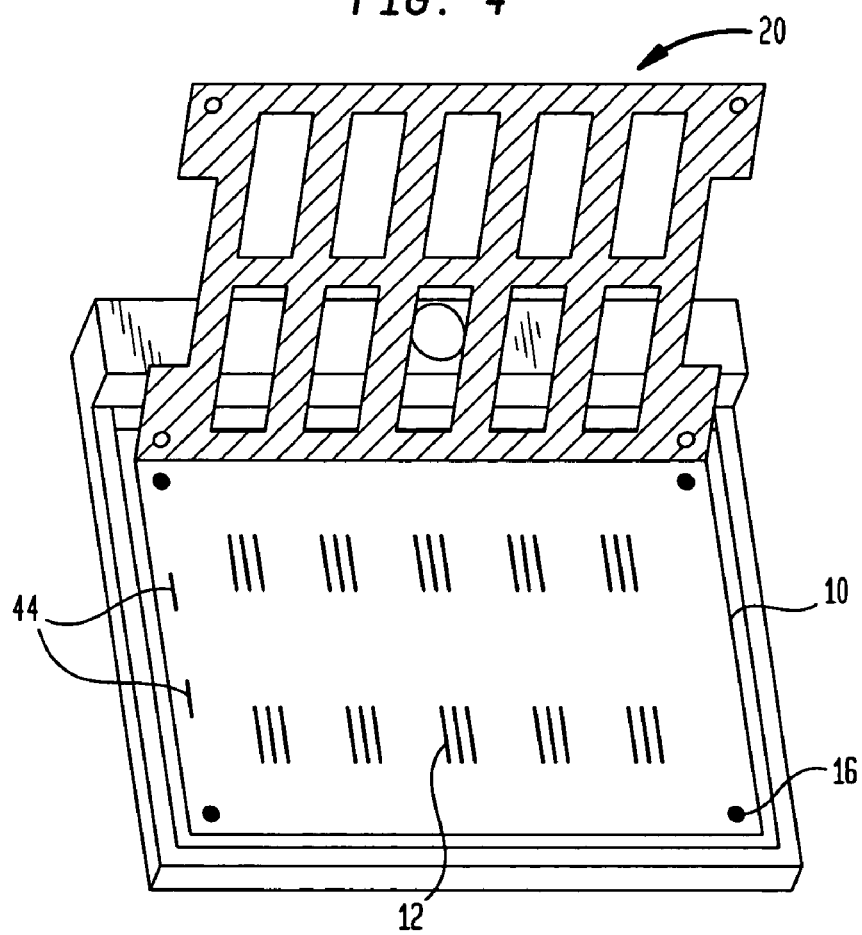
FIG. 4 is a perspective view of a template pivoted above the flash exposure equipment in accordance with an aspect of the invention.
Figure 5:
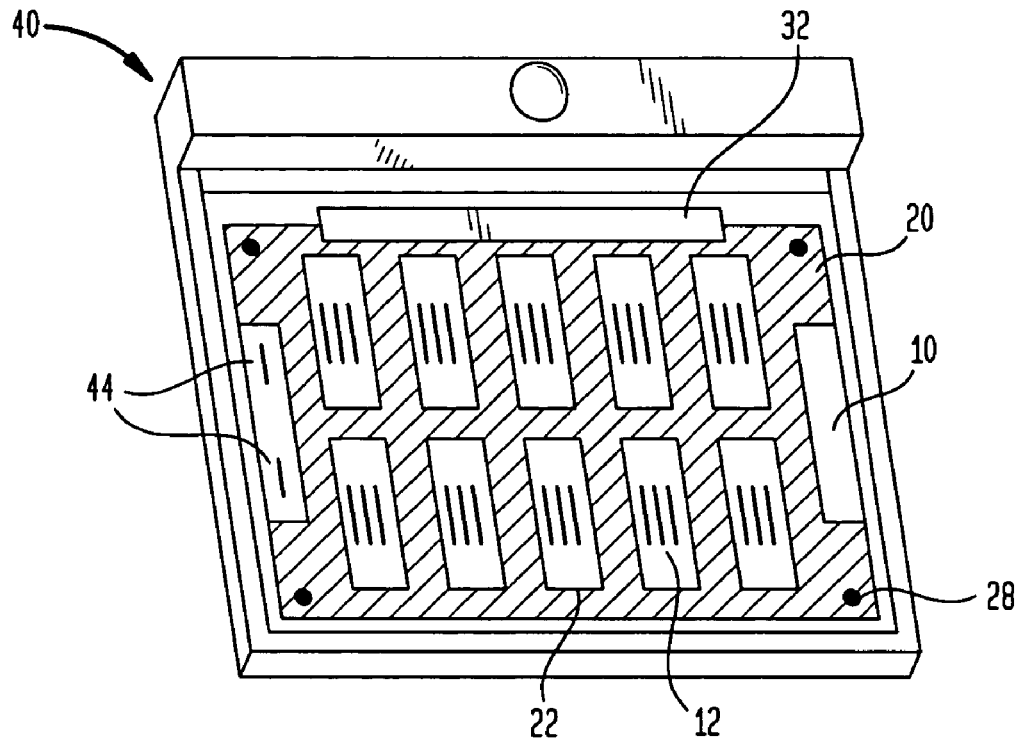
FIG. 5 is a perspective view of a template placed over printed artwork and clear protective film in accordance with an aspect of the invention.

FIG. 4 shows the template 20 pivoted away from the exposure glass 42 to allow the printed artwork 10 and protective film 18 to be placed upon the glass 42. The hinged template 20 is flipped up and towards the back of the exposure machine 40 so that the glass exposure area is open. The artwork 10 is placed onto the exposure glass 42 and the template 20 is flipped down and onto the artwork 10. The two fasteners 44 from the artwork and clear protective film 18 should fall outside of the template area and in the notches 30 at the sides of the template 20 as shown in FIG. 5.

The positioning of the artwork 10 can now be adjusted up/down/left/right from underneath the template 20 through the notches 30 at the left and right of the template 20. The four printed circles 16 at the corners of the artwork 10 are used to get rough alignment to the four circular openings 28 at the corners of the templates 20. The alignment of the artwork 10 is fine tuned to the template 20 by visual inspection to see that all the artwork 10 falls within the openings of the template 20, and that the artwork 10 is not askew with respect to the openings 22. Preferably, the four reference circles 16 are used to get rough alignment and are not relied upon for final exact alignment.

Once final alignment has been achieved, the artwork 10 may be removably affixed to the exposure glass 42 such as by the use of scotch tape or post-it flags so as to secure the position of the artwork to the exposure glass. The small piece of tape or flag is used at the left and right sides of the artwork 10 to secure it to the glass. The artwork 10 is preferably not taped to the template 20.

Figure 6:
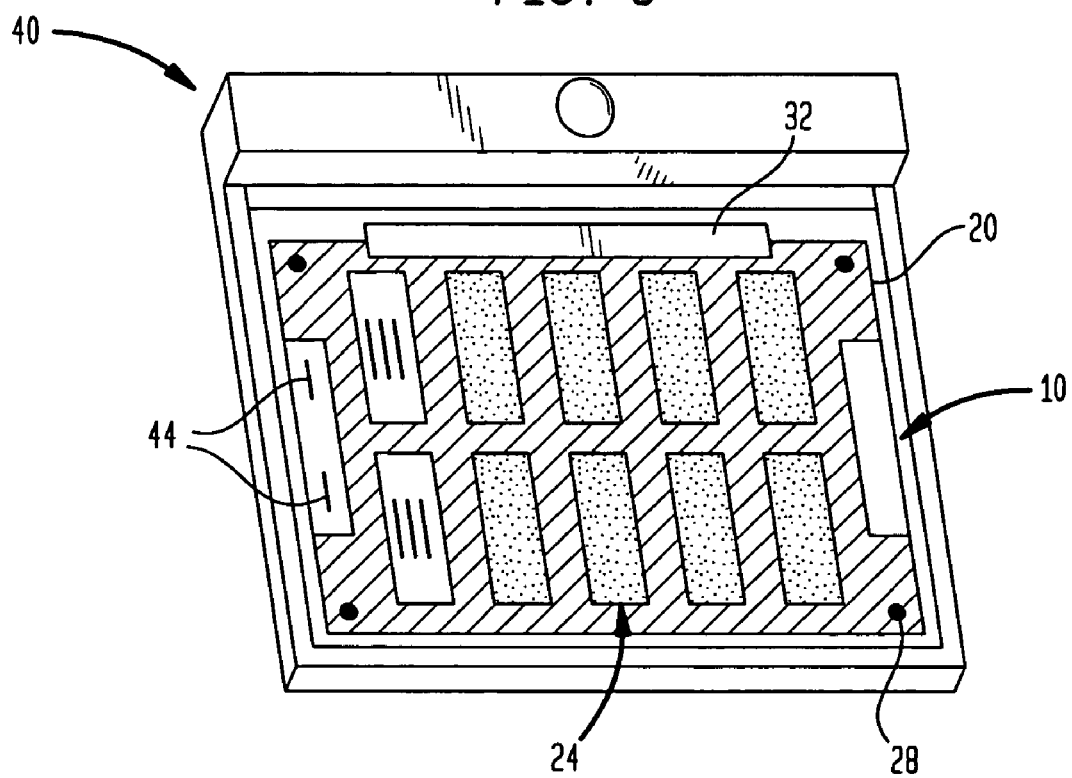
FIG. 6 is a perspective view of stamp text plates placed in the openings of the template in accordance with an aspect of the invention.

Using the template 20 as a physical guide, the stamp text plates 24 are placed into the openings 22 of the template 10 as shown in FIG. 6. until the template is filled. As the openings 22 in the template will preferably be the same size as the stamp text plates, the template 20 will capture the exposure face of the text plates, providing a positive "lock" on each text plate's position. This allows for only one position in which the text plate can be placed, providing quick means for alignment with accuracy.

Following the requirements of the flash exposure system 40, the stamp text plates are exposed. The front edges of the template 20 are then lifted to pull the exposed stamp text plates 24 from contact with the clear protective film 18. Once all the exposed text plates 24 have been removed, the template 20 is pivoted towards the back of the exposure machine 40 and the used artwork 10 is removed from the exposure area.

This system and method provides numerous advantages.

When a material is placed in the opening of a template, it is automatically aligned with the image. Thus, the present invention tends to be faster and require less skill than typical systems.

In addition, in certain aspects of the present invention, the template automatically aligns the material over the image when the material is placed in an opening, thus making it unnecessary to provide as much space between the images. If the text plates are manually placed onto the clear protective film, additional room in between each text plate is required so that the adjoining text plate is not inadvertently moved during placement. As a result of these aspects of the present invention, more materials can be processed at a time.

Moreover, the stamp text plates 24 may be removed from the clear plastic simply by lifting up the template. In typical systems, each material is individually peeled off of the plastic.

The present invention also has the advantage of flexibility. In an alternative embodiment, the invention uses a mechanical system of alignment, such as pins, pegs, rectangles or other matching shapes to mechanically align the micro-porous material and the transparent indicia material. Another embodiment uses optical sensors to detect and align the micro-porous material and the transparent indicia material. This system can be automated with the use of optical sensors to align the printed artwork with the template, although it does not need to be automated. In another embodiment, this optical system could give an audible, visual or tactical signal to perform alignment.

Another embodiment of the invention allows for customization of other material, such as signs, nameplates, badges, etc. where the clear protective sheet could be replaced with a coating transfer material. This material could, for example, be hot stamping foil, which would transfer to the sign material when exposed to heat transferred from the indicia on the transparent indicia material. Although the invention is particularly advantageous when used in connection with foam for stamps, it may be used in connection with transferring images onto other materials as well.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of exposing flash-exposable material for use in a stamp comprising:
   (a) providing artwork material bearing an image of artwork;
   (b) placing a template containing a plurality of openings over the artwork material such that the image is aligned with the openings;
   (c) placing a flash-exposable material in at least one of the openings, whereby the flash-exposable material is aligned with the opening and the image aligned with the opening, and whereby the template is thinner than the flash-exposable material; and
   (d) flash-exposing the image onto the flash-exposable material.

2. A method according to claim 1, wherein the flash-exposable material is micro-porous.

3. A method according to claim 1, comprising placing a clear protective sheet over such artwork material before placing the template over the artwork material such that the clear protective sheet is between the artwork material and the template.

4. A method according to claim 3, wherein the clear protective sheet has an energy absorbing material incorporated in it or applied to it that does not absorb heat.

5. A method according to claim 3, wherein the clear protective sheet is fastened to the artwork material.

6. A method according to claim 5, wherein the clear protective sheet is fastened to the artwork material using one or more staples on one or more sides.

7. A method according to claim 5, wherein the clear protective sheet is fastened to the artwork material by fasteners that fall outside the template area in notches at the sides of the template.

8. A method according to claim 1, further comprising applying an adhesive along the top edge of the template and placing the template with adhesive onto exposure glass of flash exposure equipment.

9. A method according to claim 8, wherein the adhesive is a strip of masking tape.

10. A method according to claim 1, further comprising removably attaching the template to exposure glass of flash exposure equipment.

11. A method according to claim 1, wherein the template is pivotably attached to exposure glass of flash exposure equipment.

12. A method according to claim 11, wherein the template is lifted from one side and pivoted away from the exposure area to allow the artwork material to be placed onto the exposure glass below the template.

13. A method according to claim 1, wherein the position of the artwork material is adjusted from under the template through notches at the sides of the template.

14. A method according to claim 13 using at least four printed circles at the corners of the artwork for a rough alignment.

15. A method according to claim 14, wherein visual inspection is used to fine-tune the alignment of the artwork.

16. A method according to claim 13, wherein a mechanical system of alignment selected from the group consisting of pins, pegs, and rectangles or other matching shapes is used to align the micro-porous material and the artwork.

17. A method according to claim 13, wherein optical sensors are used to detect and align the micro-porous material and the artwork material.

18. A method according to claim 13, wherein an adhesive selected from the group consisting of tape, adhesive flags, paste and glue are used at the sides of the artwork to secure the positioning of the artwork to exposure glass.

19. A method according to claim 1, wherein stamp text plates are placed into the openings of the template until the required artwork is covered.

20. A method according to claim 19, wherein the loaded template is exposed using a flash exposure system.

21. A method according to claim 20, comprising placing a clear protective sheet over such artwork material before placing the template over the artwork material such that the clear protective sheet is between the artwork material and the template, and wherein an edge of the template is lifted to remove exposed stamp plates from contact with the clear protective film.

22. A method according to claim 20, wherein the exposed stamp plates are removed.

23. A method of exposing flash-exposable material for use in a stamp comprising:
   (a) providing artwork material bearing a plurality of images of artwork;
   (b) placing a template containing a plurality of openings over the artwork material such that each image is aligned with an opening;
   (c) placing a flash-exposable material in each opening, whereby each flash-exposable material is aligned with an opening and the image aligned with the opening, and whereby the template is thinner than the flash-exposable material; and
   (d) flash-exposing the image onto the flash-exposable material.

24. A method according to claim 23, wherein the flash-exposable material is micro-porous.

25. A method according to claim 23, comprising placing a clear protective sheet over such artwork material before placing the template over the artwork material such that the clear protective sheet is between the artwork material and the template.

26. A method according to claim 25, wherein the clear protective sheet has an energy absorbing material incorporated in it or applied to it that does not absorb heat.

27. A method according to claim 25, wherein the clear protective sheet is fastened to the artwork material.

28. A method according to claim 27, wherein the clear protective sheet is fastened to the artwork by fasteners that fall outside the template area in notches at the sides of the template.

29. A method according to claim 25, wherein the clear protective sheet is fastened to the artwork material using one or more staples on one or more sides.

30. A method according to claim 23, further comprising applying an adhesive along the top edge of the template and placing the template with adhesive onto exposure glass of the flash exposure equipment.

31. A method according to claim 30, wherein the adhesive is a strip of masking tape.

32. A method according to claim 23, further comprising removably attaching the template to exposure glass of flash exposure equipment.

33. A method according to claim 23, wherein the template is pivotably attached to exposure glass of flash exposure equipment.

34. A method according to claim 33, wherein the template is lifted from one side and pivoted away from the exposure area to allow the artwork material to be placed onto the exposure glass below the template.

35. A method according to claim 23, wherein the position of the artwork material is adjusted from under the template through notches at the sides of the template.

36. A method according to claim 35 using at least four printed circles at the corners of the artwork for a rough alignment.

37. A method according to claim 36, wherein visual inspection is used to fine-tune the alignment of the artwork.

38. A method according to claim 35, wherein a mechanical system of alignment selected from the group consisting of pins, pegs, and rectangles or other matching shapes is used to align the micro-porous material and the artwork material.

39. A method according to claim 35, wherein optical sensors are used to detect and align the micro-porous material and the artwork material.

40. A method according to claim 35, wherein an adhesive selected from the group consisting of tape, adhesive flags, paste and glue are used at the sides of the artwork to secure the positioning of the artwork to exposure glass.

41. A method according to claim 23, wherein stamp text plates are placed into the openings of the template until the required artwork is covered.

42. A method according to claim 41, wherein the loaded template is exposed using a flash exposure system.

43. A method according to claim 42, comprising placing a clear protective sheet over such artwork material before placing the template over the artwork material such that the clear protective sheet is between the artwork material and the template, and wherein an edge of the template is lifted to remove exposed stamp plates from contact with the clear protective film.

44. A method according to claim 42, wherein the exposed stamp plates are removed.

45. A method of exposing flash-exposable material for use in a stamp comprising:
   (a) providing artwork material bearing an image of artwork;
   (b) placing a template containing a plurality of openings over the artwork material such that the image is aligned with the openings;
   (c) pivotally attaching the template to exposure glass of flash exposure equipment;
   (d) placing a flash-exposable material in at least one of the openings, whereby the flash-exposable material is aligned with the opening and the image aligned with the opening, and whereby the template is thinner than the flash-exposable material; and
   (e) flash-exposing the image onto the flash-exposable material.

46. A method according to claim 45, wherein the flash-exposable material is micro-porous.

47. A method according to claim 45, comprising placing a clear protective sheet over such artwork material before placing the template over the artwork material such that the clear protective sheet is between the artwork material and the template.

48. A method according to claim 47, wherein the clear protective sheet has an energy absorbing material incorporated in it or applied to it that does not absorb heat.

49. A method according to claim 47, wherein the clear protective sheet is fastened to the artwork material.

50. A method according to claim 49, wherein the clear protective sheet is fastened to the artwork material using one or more staples on one or more sides.

51. A method according to claim 50, wherein the template is lifted from one side and pivoted away from the exposure area to allow the artwork material to be placed onto exposure glass below the template.

52. A method according to claim 49, wherein the clear protective sheet is fastened to the artwork material by one or more fasteners that fall outside the template area in notches at the sides of the template.

53. A method according to claim 45, wherein the position of the artwork material is adjusted from under the template through notches at the sides of the template.

54. A method according to claim 53 using at least four printed circles at the corners of the artwork for a rough alignment.

55. A method according to claim 54, wherein visual inspection is used to fine-tune the alignment of the artwork.

56. A method according to claim 45, wherein stamp text plates are placed into the openings of the template until the required artwork is covered.

57. A method according to claim 56, wherein the loaded template is exposed using a flash exposure system.

58. A method according to claim 57, comprising placing a clear protective sheet over such artwork material before placing the template over the artwork material such that the clear protective sheet is between the artwork material and the template, and wherein an edge of the template is lifted to remove exposed stamp plates from contact with the clear protective film.

59. A method according to claim 57, wherein the exposed stamp plates are removed.

60. An apparatus for exposing flash-exposable material for use in a stamp comprising:
   (a) artwork material bearing an image of artwork;
   (b) a template containing a plurality of openings;
   (c) an alignment system for aligning the artwork material with the template such that the image is aligned with the openings;
   (d) a flash-exposable material in at least one of the openings, whereby the flash-exposable material is aligned with the opening and the image aligned with the opening, and whereby the template is thinner than the flash-exposable material; and (e) flash-exposure equipment for flash-exposing the image onto the flash-exposable material.

61. An apparatus according to claim 60, wherein the flash-exposable material is micro-porous.

62. An apparatus according to claim 60, comprising a clear protective sheet over the artwork material.

63. An apparatus for exposing flash-exposable material for use in a stamp comprising:
   (a) artwork material bearing a plurality of images of artwork;
   (b) a template containing a plurality of openings;
   (c) an alignment system for aligning the artwork material with the template such that each image is aligned with an opening;
   (d) a plurality of flash-exposable materials in the openings, whereby each flash-exposable material is aligned with an opening and the image aligned with the opening, and whereby the template is thinner than the flash-exposable materials; and
   (e) flash-exposure equipment for flash-exposing the image onto the flash-exposable materials.

64. An apparatus according to claim 63, wherein the flash-exposable material is micro-porous.

65. An apparatus according to claim 63, comprising a clear protective sheet over the artwork material.

* * * * *